United States Patent
Harrison

(10) Patent No.: US 12,088,210 B2
(45) Date of Patent: Sep. 10, 2024

(54) GALLIUM NITRIDE BI-DIRECTIONAL HIGH ELECTRON MOBILITY TRANSISTOR IN SWITCHED MODE POWER CONVERTER APPLICATIONS

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 257 days.

(21) Appl. No.: 17/842,459

(22) Filed: Jun. 16, 2022

(65) Prior Publication Data

US 2022/0416678 A1  Dec. 29, 2022

Related U.S. Application Data

(60) Provisional application No. 63/214,260, filed on Jun. 23, 2021.

(51) Int. Cl.
| | |
|---|---|
| *H01L 29/205* | (2006.01) |
| *H02M 5/293* | (2006.01) |
| *H02M 7/48* | (2007.01) |
| *H02M 7/5387* | (2007.01) |
| *H01L 29/20* | (2006.01) |
| *H01L 29/778* | (2006.01) |

(52) U.S. Cl.
CPC ........ *H02M 5/293* (2013.01); *H02M 7/4815* (2021.05); *H02M 7/5387* (2013.01); *H01L 29/2003* (2013.01); *H01L 29/205* (2013.01); *H01L 29/7786* (2013.01)

(58) Field of Classification Search
CPC .. H02M 5/293; H02M 7/4815; H02M 7/5387; H01L 29/2003; H01L 29/205; H01L 29/7786
See application file for complete search history.

(56) References Cited

U.S. PATENT DOCUMENTS

| | | |
|---|---|---|
| 5,003,246 A | 3/1991 | Nadd |
| 7,397,280 B2 | 7/2008 | Ker et al. |
| 8,203,376 B2 * | 6/2012 | Morita ............... H01L 29/7787 327/427 |
| 9,130,570 B2 * | 9/2015 | Fornage .............. H03K 17/693 |
| 9,837,522 B2 | 12/2017 | Prechtl et al. |
| 10,804,393 B1 | 10/2020 | Baliga |
| 2007/0235293 A1 | 10/2007 | Steimer et al. |
| 2009/0065810 A1 | 3/2009 | Honea et al. |
| 2009/0167411 A1 | 7/2009 | Machida et al. |
| 2013/0270917 A1 | 10/2013 | Yatsu |

(Continued)

OTHER PUBLICATIONS

PCT International Search Report and Written Opinion for Application No. PCT/US2022/034222 dated Oct. 12, 2022, 10 pgs.

*Primary Examiner* — Gary L Laxton
(74) *Attorney, Agent, or Firm* — Moser Taboada

(57) ABSTRACT

A switched mode power converter is provided herein and comprises a cycloconverter comprising a plurality of switches, wherein each switch of the plurality of switches is a native four quadrant bi-directional switch with a common drift region configured to allow current flow in a first direction from a first source terminal to second source terminal and in a second direction from the second source terminal to the first direction.

17 Claims, 3 Drawing Sheets

(56) References Cited

U.S. PATENT DOCUMENTS

| | | |
|---|---|---|
| 2017/0040908 A1 | 2/2017 | Fornage et al. |
| 2020/0119179 A1* | 4/2020 | Mishra ................ H01L 29/0692 |
| 2020/0287536 A1 | 9/2020 | Udrea et al. |
| 2022/0157981 A1* | 5/2022 | Gupta ................ H01L 27/0605 |

* cited by examiner

GALLIUM NITRIDE BI-DIRECTIONAL HIGH ELECTRON MOBILITY TRANSISTOR IN SWITCHED MODE POWER CONVERTER APPLICATIONS

CROSS-REFERENCE TO RELATED APPLICATIONS

The present application claims the benefit of and priority to U.S. Provisional Application Ser. No. 63/214,260, filed Jun. 23, 2021, the entire contents of which is incorporated herein by reference.

BACKGROUND

Field of the Disclosure

Embodiments of the disclosure relate to switched mode power converters and, in particular, switched mode power converters comprising bi-directional switches.

Description of the Related Art

Switched mode power converters are frequently used in renewable energy systems, such as photovoltaic (PV) systems. One type of switched mode power converter is known as a cycloconverter (or matrix converter) and requires the use of at least one bi-directional switch (transistor), which also may be referred to as a 4-quadrant switch (4QS). Cycloconverters have cost and performance advantages compared to conventional switched mode power converter designs that are based around unipolar power semiconductor devices in AC:DC, DC:AC, and AC:AC applications.

The bi-directional switches utilized in cycloconverters are formed from a pair of uni-directional (polarity sensitive) transistors, such as silicon super-junction metal-oxide-semiconductor field-effect transistors (MOSFETs), in a 'back-to-back' series connection. However, the complexity of designing 4QS solutions based on a back-to-back series connected pair of power semiconductor devices has hindered the adoption of cycloconverter-based switched mode converter designs.

Therefore, there is a need in the art for an improved four quadrant bi-directional switch for use in switched mode power converters.

SUMMARY

In accordance with at least some aspects of the present disclosure, a switched mode power converter comprises a cycloconverter comprising a plurality of switches, wherein each switch of the plurality of switches is a native four quadrant bi-directional switch with a common drift region configured to allow current flow in a first direction from a first source terminal to second source terminal and in a second direction from the second source terminal to the first direction.

In accordance with at least some aspects of the present disclosure, a power conversion system comprises a DC component coupled to a primary winding of a transformer and a switched mode power converter coupled to a secondary winding of the transformer and comprising a cycloconverter comprising a plurality of switches, wherein each switch of the plurality of switches is a native four quadrant bi-directional switch with a common drift region configured to allow current flow in a first direction from a first source terminal to second source terminal and in a second direction from the second source terminal to the first direction.

In accordance with at least some aspects of the present disclosure, a switched mode power converter comprises a cycloconverter comprising a plurality of switches, wherein each switch of the plurality of switches is a native four quadrant bi-directional switch with a common drift region configured to allow current flow in a first direction and a second direction different from the first direction.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to switched mode power converters comprising native bi-directional switches. In some embodiments, the switched mode power converter is a bi-directional (DC:AC and AC:DC) series-resonant cycloconverter topology designed to work with a single-phase AC connection. In other embodiments, the switched mode power converter is a three-phase series-resonant cycloconverter topology. In still other embodiments, the switched mode power converter may be any type of AC:DC, DC:AC, or AC:AC power converter that utilizes fully bi-directional switches, such as Highly Efficient and Reliable Inverter Concept (HERIC) inverters, three-level T-type converters, AC link Inverters (also known as "partial resonant converters"), and the like.

The native bi-directional switches described herein are four quadrant bi-directional switches (also referred to as 4QS), for example gallium nitride (GaN) high mobility electron transistor (HEMT) switches, built as native 4QS devices. Such GaN HEMT 4QS devices have higher performance at a lower cost than 4QS devices composed of a 'back-to-back' pair of conventional uni-directional transistors, such as uni-directional GaN HEMT devices.

In various embodiments, the switched mode power converters described herein are used in renewable energy systems such as photovoltaic (PV) inverter applications, although the switched mode power converters may be used for any suitable application.

Figure 1:
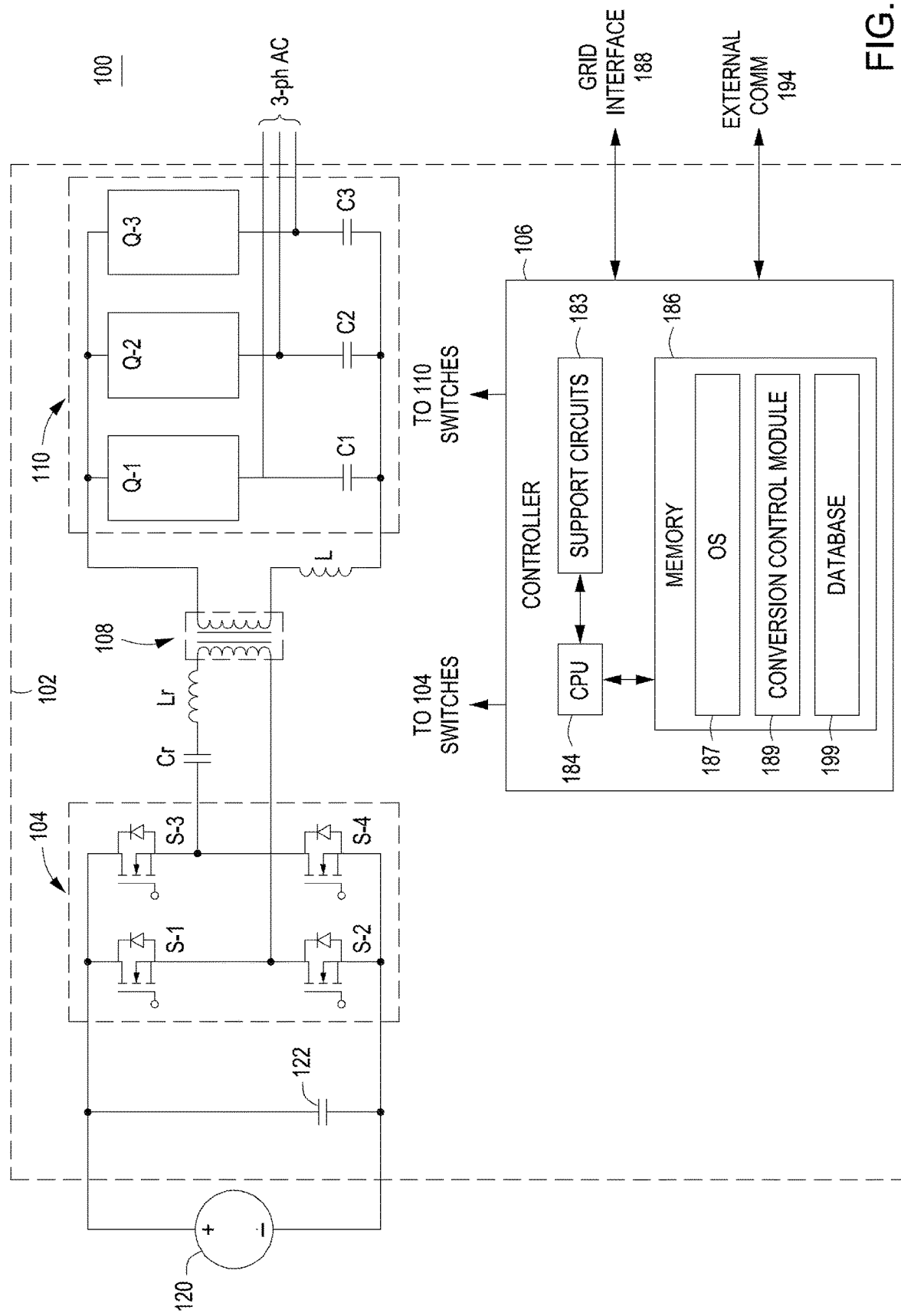
FIG. 1 is a schematic diagram of a power conversion system comprising a switched mode power converter in accordance with embodiments of the present disclosure.

FIG. 1 is a schematic diagram of a power conversion system 100 comprising a switched mode power converter 102 in accordance with embodiments of the present disclosure. This diagram only portrays one variation of the myriad of possible system configurations. The present disclosure can function in a variety of power generation environments and systems.

The power conversion system 100 comprises a DC component 120, such as a PV module or a battery, coupled to a DC side of the switched mode power converter 102 (referred to herein as "converter 102"). In other embodiments the DC component 120 may be any suitable type of DC components, such as another type of renewable energy source (e.g., wind farms, hydroelectric systems, and the like), other types of energy storage components, and the like.

The converter 102 comprises a capacitor 122 coupled across the DC component 120 as well as across an H-bridge 104 formed from switches S-1, S-2, S-3 and S-4. The switches S-1 and S-2 are coupled in series to form a left leg of the H-bridge 104, and the switches S-3 and S-4 are coupled in series to form a right leg of the H-bridge 104.

The output of the H-bridge 104 is coupled across a series combination of a capacitor Cr and inductor L, which form a resonant tank, and the primary winding of a transformer 108. In other embodiments, the resonant tank may be formed by a different configuration of the capacitor Cr and the inductor Lr (e.g., the capacitor Cr and the inductor L may be coupled in parallel); in some embodiments, Lr may represent a leakage inductance from the transformer 108 rather than a physical inductor.

A series combination of the secondary winding of the transformer 108 and an inductor L is coupled across a cycloconverter 110 which produces a three-phase AC output, although in other embodiments the cycloconverter 110 may produce one or two phases of AC at its output. The cycloconverter 110 comprises three 4Q bi-directional switches Q-1, Q-2, and Q-3 (which may be collectively referred to as switches Q) respectively in a first leg, a second leg, and a third leg coupled in parallel to one another. In accordance with embodiments of the present disclosure, each of the switches Q-1, Q-2, and Q-3 is a native four quadrant bi-directional switch, described in detail further below with respect to FIG. 3.

The first cycloconverter leg comprises the 4Q switch Q-1 coupled to a capacitor C1, the second cycloconverter leg comprises the 4Q switch Q-2 coupled to a capacitor C2, and the third cycloconverter leg comprises a 4Q switch Q-3 coupled to a capacitor C3. A first AC output phase line is coupled between the switch Q-1 and the capacitor C1, a second AC output phase line is coupled between the switch Q-2 and the capacitor C2, and a third AC output phase line is coupled between the switch Q-3 and the capacitor C3. The converter 102 may also include additional circuitry not shown, such as voltage and/or current monitors, for obtaining data for power conversion, data reporting, and the like.

The converter 102 additionally comprises a controller 106 coupled to the H-bridge switches (S-1, S-2, S-3, and S-4) and the cycloconverter switches (Q-1, Q-2, and Q-3) for operatively controlling the switches to generate the desired output power. In some embodiments, the converter 102 may function as a bi-directional converter.

The controller 106 comprises a CPU 184 coupled to each of support circuits 183 and a memory 186. The CPU 184 may comprise one or more conventionally available microprocessors or microcontrollers; additionally or alternatively, the CPU 184 may include one or more application specific integrated circuits (ASICs). The support circuits 183 are well known circuits used to promote functionality of the CPU 184. Such circuits include, but are not limited to, a cache, power supplies, clock circuits, buses, input/output (I/O) circuits, and the like. The controller 106 may be implemented using a general purpose computer that, when executing particular software, becomes a specific purpose computer for performing various embodiments of the present disclosure.

The memory 186 is a non-transitory computer readable medium such as random access memory, read only memory, removable disk memory, flash memory, and various combinations of these types of memory. The memory 186 is sometimes referred to as main memory and may, in part, be used as cache memory or buffer memory. The memory 186 generally stores the operating system (OS) 187, if necessary, of the controller 106 that can be supported by the CPU capabilities. In some embodiments, the OS 187 may be one of a number of commercially available operating systems such as, but not limited to, LINUX, Real-Time Operating System (RTOS), and the like.

The memory 186 may store various forms of application software, such as a conversion control module 189 for controlling power conversion by the converter 102, for example maximum power point tracking (MPPT), switching, and the like. The memory 186 may further store a database 199 for storing various data. The controller 106 further processes inputs and outputs to external communications 194 (i.e., gateway) and a grid interface 188.

Figure 2:
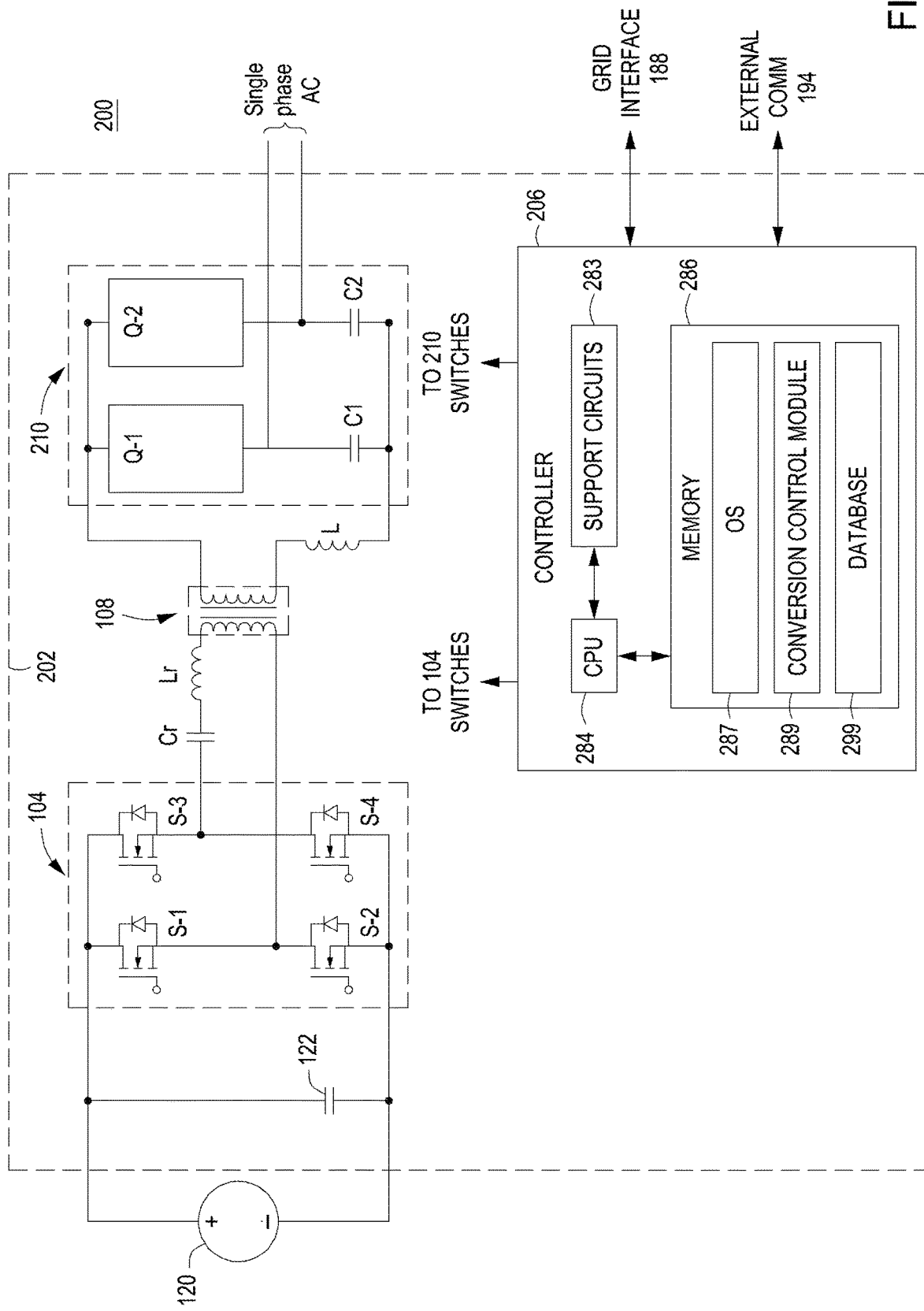
FIG. 2 is a schematic diagram of a power conversion system comprising a switched mode power converter in accordance with embodiments of the present disclosure.

FIG. 2 is a schematic diagram of a power conversion system 200 comprising a switched mode power converter 202 in accordance with embodiments of the present disclosure.

The power conversion system 200 comprises the DC component 120 coupled to a DC side of the switched mode power converter 202 (referred to herein as "converter 202"). The converter 202 comprises the capacitor 122 coupled across the DC component 120 and the H-bridge 104, as described above with respect to the converter 102. The output of the H-bridge 104 is coupled across a series combination of the capacitor Cr and the inductor Lr, which form a resonant tank, and the primary winding of the transformer 108, as described above with respect to the converter 102. In other embodiments, the resonant tank may be formed by a different configuration of the capacitor Cr and the inductor Lr (e.g., the capacitor Cr and the inductor L may be coupled in parallel); in some embodiments, Lr may represent a leakage inductance of the transformer 108 rather than a physical inductor.

A series combination of the secondary winding of the transformer 108 and the inductor L is coupled across a cycloconverter 210 which produces a single-phase AC output. The cycloconverter 210 comprises two bi-directional switches Q-1 and Q-2, (collectively referred to as switches Q) respectively in a first leg and a second leg coupled in parallel to one another. In accordance with embodiments of the present disclosure, each of the switches Q-1 and Q-2 is a native four quadrant bi-directional switch, described in detail further below with respect to FIG. 3.

The first cycloconverter leg comprises the 4Q switch Q-1 coupled to the capacitor C1, and the second cycloconverter leg comprises the 4Q switch Q-2 coupled to the capacitor C2. A first AC output phase line is coupled between the switch Q-1 and the capacitor C1, and a second AC output phase line is coupled between the switch Q-2 and the capacitor C2. The converter 202 may also include additional circuitry not shown, such as voltage and/or current monitors, for obtaining data for power conversion, data reporting, and the like.

The converter 202 additionally comprises a controller 206 coupled to the H-bridge switches (S-1, S-2, S-3, and S-4), and the cycloconverter switches (Q-1 and Q-2) for operatively controlling the switches to generate the desired output power. In some embodiments, the converter 202 may function as a bi-directional converter.

The controller 206 comprises a CPU 284 coupled to each of support circuits 283 and a memory 286. The CPU 284 may comprise one or more conventionally available microprocessors or microcontrollers; additionally or alternatively, the CPU 284 may include one or more application specific integrated circuits (ASICs). The support circuits 283 are well known circuits used to promote functionality of the CPU 284. Such circuits include, but are not limited to, a cache, power supplies, clock circuits, buses, input/output (I/O) circuits, and the like. The controller 206 may be implemented using a general purpose computer that, when executing particular software, becomes a specific purpose computer for performing various embodiments of the present disclosure.

The memory 286 is a non-transitory computer readable medium such as random access memory, read only memory, removable disk memory, flash memory, and various combinations of these types of memory. The memory 286 is sometimes referred to as main memory and may, in part, be used as cache memory or buffer memory. The memory 286 generally stores the operating system (OS) 287, if necessary, of the controller 206 that can be supported by the CPU capabilities. In some embodiments, the OS 287 may be one of a number of commercially available operating systems such as, but not limited to, LINUX, Real-Time Operating System (RTOS), and the like.

The memory 286 may store various forms of application software, such as a conversion control module 289 for controlling power conversion by the converter 202, for example maximum power point tracking (MPPT), switching, and the like. The memory 286 may further store a database 299 for storing various data. The controller 206 further processes inputs and outputs to external communications 194 (i.e., gateway) and the grid interface 188.

Figure 3:
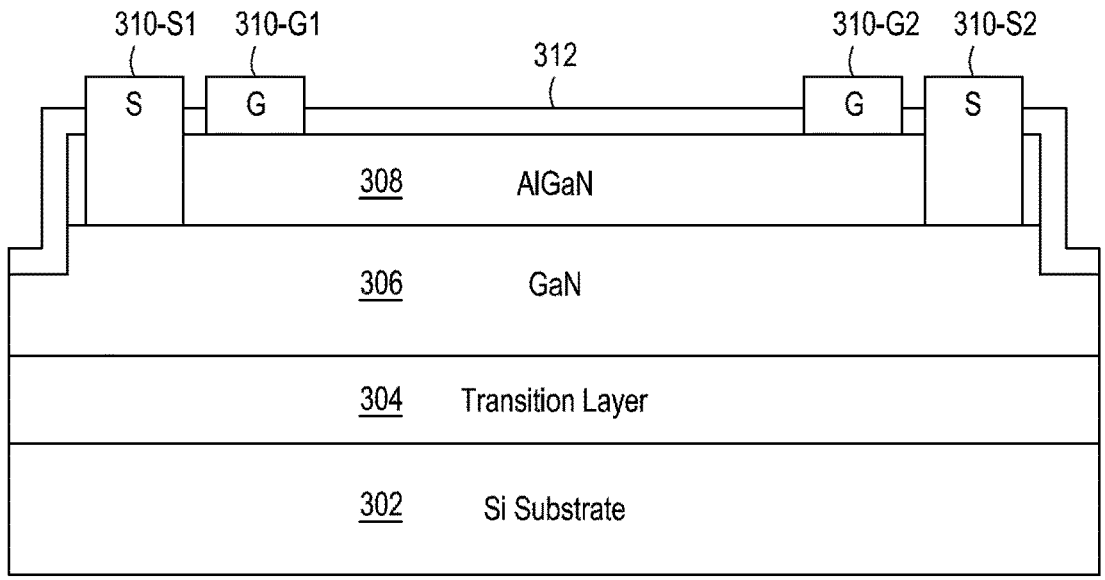
FIG. 3 is a cross-sectional view depicting a structure of the switch Q in accordance with one or more embodiments of the present disclosure.

FIG. 3 is a cross-sectional view depicting a structure of the switch Q in accordance with one or more embodiments of the present disclosure. The switch Q is a gallium nitride (GaN) high electron mobility transistor (HEMT) structure comprising layers 302, 304, 306, 308, and 312 with source terminals 310-S-1/310-S-2 and gate terminals 310-G1/310-G2 coupled to the layer 308. In contrast to a conventional uni-directional GaN HEMT switch, which is fabricated as a lateral device with a drift region between drain and source connections being parallel to the top surface of the GaN die, the switch Q comprises two gate-source structures (one of which is used in place of the drain structure of the conventional uni-directional GaN HEMT switch) to facilitate the native four quadrant bi-directional switch Q. As such, the switch Q allows the common drift region to be used in either direction (i.e., for current flowing in the direction from the source terminal 310-S-1 to the source terminal 310-S-2, or for current flowing in the direction from the source terminal 310-S-2 to the source terminal 310-S-1) and block either a positive or a negative voltage, thereby providing a GaN area reduction as compared to a conventional 4Q device fabricated by connecting two conventional GaN HEMT devices together. In various embodiments, the switch Q may have a die area that is half of the die area of a conventional uni-directional GaN HEMT and thus provide a 4:1 die area advantage as compared to a pair of conventional uni-directional GaN HEMTs connected together to form a 4Q device. Further, the ratio of gate drive loss to conduction loss ratio (i.e., $Q_G/R_{SS-ON}$) for the switch Q is two times lower than for a GaN 4Q switch constructed out of two conventional uni-directional GaN HEMT devices due to the 2:1 die area per switch difference (only one of the gates 310-G1, 310-G2 is switched at any given time).

As depicted in FIG. 3, the base layer 302 is a silicon (Si) substrate, typically on the order of 0.7 mm thick. The layer 304, which is sandwiched between the layers 302 and 306, is a transition layer (which in some embodiments may comprise two or more different elements), typically on the order of a few nano-meters thick. The layer 306, which is sandwiched between the layers 304 and 308, is a gallium nitride (GaN) layer, typically on the order of a few micrometers thick. The layer 308, atop the layer 306, is an aluminum gallium nitride (AlGaN) layer, typically on the order of a few micro-meters thick. The layer 312, which sits atop the layer 308, is an inert passivation layer (e.g., a glass-like deposited layer) that is used to prevent impurities from the environment from leaching into the structure of the switch Q.

The source terminals 310-S-1/310-S-2 are typically thin metal layers with composition known in the art to make ohmic contact to the layer 308, and the gate terminals 310-G1/310-G2 are typically thin metal layers with composition known in the art that produce a Schottky contact to the layer 308.

In some alternative embodiments, other types of materials and/or structures may be used for the switch Q. For example, wide bandgap materials other than GaN, such as silicon carbide, may be utilized, and/or a structure other than the HEMT structure, such as a metal-oxide-semiconductor field-effect transistor (MOSFET) structure, may be used.

Examples of the switch Q may be found in commonly assigned U.S. Pat. No. 9,130,570, titled "Four Quadrant Bidirectional Switch", which is herein incorporated by reference in its entirety.

Figure 4:
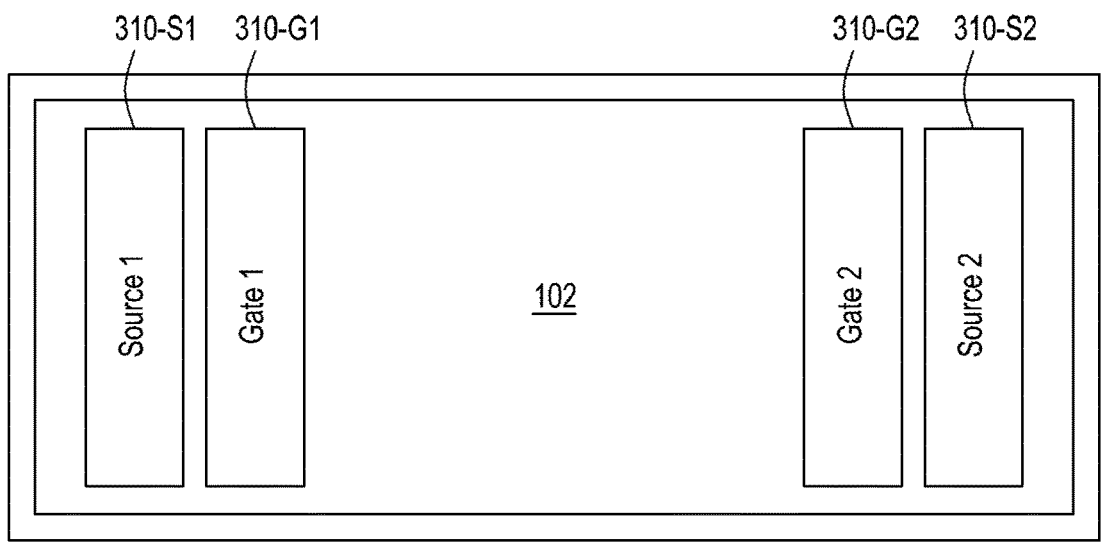
FIG. 4 is a plan view of the switch Q in accordance with embodiments of the present disclosure.

FIG. 4 is a plan view of the switch Q in accordance with embodiments of the present disclosure. The plan view of the switch Q depicts the source and gate terminals 310-S-1 and 310-G1 located near one another at one end of the top of the switch Q, and the source and gate terminals 310-S-2 and 310-G2 located near one another at the opposite end of the top of the switch Q.

The foregoing description of embodiments of the disclosure comprises a number of elements, devices, circuits and/or assemblies that perform various functions as described. These elements, devices, circuits, and/or assemblies are exemplary implementations of means for performing their respectively described functions.

While the foregoing is directed to embodiments of the present disclosure, other and further embodiments of the disclosure may be devised without departing from the basic scope thereof, and the scope thereof is determined by the claims that follow.

The invention claimed is:

1. A switched mode power converter, comprising:
 a cycloconverter comprising a plurality of switches, wherein each switch of the plurality of switches is a native four quadrant bi-directional switch with a common drift region configured to allow current flow in a first direction from a first source terminal to second source terminal and in a second direction from the second source terminal to the first direction, wherein each switch of the plurality of switches comprises two gate-source structures that extend through an inert passivation layer to couple to an aluminum gallium nitride (AlGaN) layer.

2. The switched mode power converter of claim 1, wherein the native four quadrant bi-directional switch is a gallium nitride (GaN) high mobility electron transistor (HEMT).

3. The switched mode power converter of claim 1, wherein the aluminum gallium nitride (AlGaN) layer is disposed atop a gallium nitride (GaN) layer which is sandwiched between the aluminum gallium nitride (AlGaN) layer and a transition layer.

4. The switched mode power converter of claim 3, wherein the inert passivation layer sits atop the aluminum gallium nitride (AlGaN) and prevents impurities from leaching into each switch.

5. The switched mode power converter of claim 1, wherein each switch of the plurality of switches comprises a 2:1 die area.

6. The switched mode power converter of claim 1, wherein each switch of the plurality of switches produces one of a single-phase AC output or a three-phase AC output.

7. A power conversion system, comprising:
   a DC component coupled to a primary winding of a transformer; and
   a switched mode power converter coupled to a secondary winding of the transformer and comprising a cycloconverter comprising a plurality of switches, wherein each switch of the plurality of switches is a native four quadrant bi-directional switch with a common drift region configured to allow current flow in a first direction from a first source terminal to second source terminal and in a second direction from the second source terminal to the first direction, wherein each switch of the plurality of switches comprises two gate-source structures that extend through an inert passivation layer to couple to an aluminum gallium nitride (AlGaN) layer.

8. The power conversion system of claim 7, wherein the native four quadrant bi-directional switch is a gallium nitride (GaN) high mobility electron transistor (HEMT).

9. The power conversion system of claim 7, wherein the aluminum gallium nitride (AlGaN) layer is disposed atop a gallium nitride (GaN) layer which is sandwiched between the aluminum gallium nitride (AlGaN) layer and a transition layer.

10. The power conversion system of claim 9, wherein the inert passivation layer sits atop the aluminum gallium nitride (AlGaN) and prevents impurities from leaching into each switch.

11. The power conversion system of claim 7, wherein each switch of the plurality of switches comprises a 2:1 die area.

12. The power conversion system of claim 7, wherein each switch of the plurality of switches produces one of a single-phase AC output or a three-phase AC output.

13. A switched mode power converter, comprising:
    a cycloconverter comprising a plurality of switches, wherein each switch of the plurality of switches is a native four quadrant bi-directional switch with a common drift region configured to allow current flow in a first direction and a second direction different from the first direction, wherein each switch of the plurality of switches comprises two gate-source structures that extend through an inert passivation layer to couple to an aluminum gallium nitride (AlGaN) layer.

14. The switched mode power converter of claim 13, wherein the native four quadrant bi-directional switch is a gallium nitride (GaN) high mobility electron transistor (HEMT).

15. The switched mode power converter of claim 13, wherein the aluminum gallium nitride (AlGaN) layer is disposed atop a gallium nitride (GaN) layer which is sandwiched between the aluminum gallium nitride (AlGaN) layer and a transition layer.

16. The switched mode power converter of claim 15, wherein the inert passivation layer sits atop the aluminum gallium nitride (AlGaN) and prevents impurities from leaching into each switch.

17. The switched mode power converter of claim 13, wherein each switch of the plurality of switches comprises a 2:1 die area.

* * * * *